United States Patent [19]

Folberth

[11] 4,059,814

[45] Nov. 22, 1977

[54] CONTROLLABLE SEMICONDUCTOR ELEMENT

[75] Inventor: Otto G. Folberth, Boblingen, Germany

[73] Assignee: International Business Machines Corporation, Armonk, N.Y.

[21] Appl. No.: 589,303

[22] Filed: June 23, 1975

[30] Foreign Application Priority Data

Aug. 14, 1974 Germany .................. 2439051

[51] Int. Cl.² .............. H03H 7/22; H03H 7/30; H03C 1/36; H03C 3/22
[52] U.S. Cl. .................. 333/29; 332/16 R; 332/16 T; 333/31 R; 357/1
[58] Field of Search .......... 333/31 R, 29, 31 A, 333/95 R, 96, 84 R, 84 M; 332/16 R, 16 T, 29 R, 31, 51; 357/1; 307/293

[56] References Cited

U.S. PATENT DOCUMENTS

| | | | |
|---|---|---|---|
| 3,358,245 | 12/1967 | Pigg | 332/52 X |
| 3,721,923 | 3/1973 | Gray et al. | 333/31 A |
| 3,778,643 | 12/1973 | Jaffe | 333/31 R X |
| 3,866,143 | 2/1975 | Jacobs et al. | 333/31 R X |
| 3,916,351 | 10/1975 | Jacobs et al. | 333/73 R |

FOREIGN PATENT DOCUMENTS 2,233,468  1/1974  Germany .................. 333/84 M

OTHER PUBLICATIONS

Levin, et al.—"Millimeter-Wave Phase Shifter," in RCA Review, vol. 34, Sept. 1972; pp. 489-505.

*Primary Examiner*—Harold A. Dixon
*Assistant Examiner*—Marvin Nussbaum

*Attorney, Agent, or Firm*—George O. Saile

[57] ABSTRACT

Controllable semiconductor element with an active semiconductor path controlled by means of conductivity modulation.

The structure corresponds to a semiconductor arrangement with applied conductive strips. On the lower side of a semiconductor layer (1) a metal layer (2) is applied. The upper side is covered with an insulation layer (3) on which extends conductive strip (4). At the beginning of conductive strip (4) and beneath at metal layer (2), the input terminals (7) and (8) are provided. At the end of conductive strip (4) and beneath, at metal layer (2), output terminals (11) and (12) are arranged. Besides, at conductive strip (4) and metal layer (2), the control terminals (15) and (16) are applied.

If at the two input terminals (7) and (8) an input signal is applied of a frequency which is higher than the dielectric relaxation frequency a corresponding wave propagates from the input along the semiconductive layer (1), and can be derived at the output as an output signal. If simultaneously a control signal is applied to the control terminals (15, 16) whose frequency is much lower than the relaxation frequency additional carriers are generated or deducted in the semiconductive layer (1), on the basis of the known field effect, as a function of the polarity of this control signal and the doping of the semiconductor layer. This means that the conductivity of the semiconductor layer (1) is modulated with the control signal frequency. The conductivity modulation effects a corresponding transit time modulation and/or amplitude modulation of the input signal transmitted via the semiconductor path to the output.

5 Claims, 4 Drawing Figures

CONTROLLABLE SEMICONDUCTOR ELEMENT

BACKGROUND OF THE INVENTION

The invention relates to a controllable semiconductor element with an active semiconductor path controlled by conductivity modulation.

DESCRIPTION OF THE PRIOR ART

The known active semiconductor elements originate from transistor technology which in turn bases on semiconductor physics. In the conception of transistors it is considered that the electrical properties of semiconductor zones can be intentionally influenced by control parameters. Particularly the carrier injection as used in bipolar transistors, and the carrier influence as used in field effect transistors have supplied satisfactory results as control medium.

In both cases, the control mechanism bases on a conductivity modulation of the active zone (base zone or channel zone, respectively) by means of adding or deducting movable carriers by the control medium, i.e. by injection of influence. The conductivity modulation of the active zone is used in order to generate by an input signal an altered output signal. To give an example, a sinus-shaped input signal is changed into a correspondingly amplified, possibly out of phase, but otherwise only slightly altered output signal of the same frequency.

All transistors can only correctly operate as signal converters under the condition that the dielectric relaxation time is short compared with all other characteristic times occurring in the working cycle. The dielectric relaxation time is defined as $\tau_{di} = \rho^2 \cdot \epsilon$, $\rho$ being the resistivity and $\epsilon$ the dielectricity constant. The introduction of the dielectric relaxation time is based on the fact that the polarization induced by the application of an electric field ceases abruptly after the switching off of the field. In the electric alternating field there is a phase shift between field intensity and polarization. With frequencies comparable to the reciprocal relaxation time, i.e. to the relaxation frequency, this has the effect of dispersion and absorption of the electric waves.

For maximum frequencies the transistors have therefore to be relatively highly doped, otherwise, the relaxation frequency would reach the order of the frequency to be amplified, and the transistors would no longer function.

It is the object of the invention to provide a controllable semiconductor element to which the above restriction does not apply. Efforts are therefore made to get a semiconductor element where the general limitations regarding the cut-off frequency do not exist, and by means of which signal frequencies of any height can be processed as long as operations remain in a field of (anormal) dispersion.

From IEEE Transactions on Microwave Theory and Techniques, Vol. MTT-19, No. 11, November 1971, pp. 869–881, theoretical and experimental investigation results are already known relating to the high frequency signal transmission characteristics of circuitry used at present in integrated semiconductor technique. There, planar metallization is involved extending over an insulation layer applied on the surface of the semiconductor substrate, and connecting the individual active and passive elements integrated in the substrate.

SUMMARY OF THE PRESENT INVENTION

According to the invention, this problem for a controllable semiconductor element with an active semiconductor path controlled by conductivity modulation is solved in that along a semiconductor path between an input where an input signal of a signal frequency above the relaxation frequency is coupled in, and an output where the output signal is coupled out, control means are provided via which, by conductivity modulation with a control frequency below the relaxation frequency, the transition time of the signal guided via the semiconductor path, can be controlled.

Advantageous embodiments consist particularly in that the conductivity modulation takes place by means of carrier injection along the semiconductor path, or that the conductivity modulation is effected by means of influence along the semiconductor path.

Advantageous embodiments of the semiconductor element according to the invention are specified in the subclaims.

BRIEF DESCRIPTION OF THE DRAWINGS

Below, the invention will be described by means of some advantageous embodiments represented in the drawing. The Figures show the following.

DESCRIPTION OF THE PREFERRED EMBODIMENTS

Figure 1:
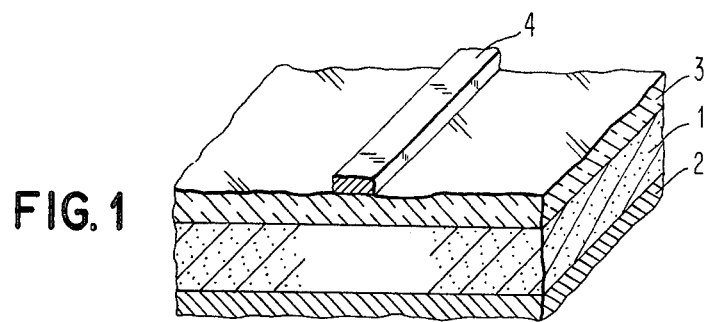
FIG. 1 shows the known basic structure of an integrated circuit block with one conductive line.

FIG. 1 shows the basic structure of the design of the before mentioned IEEE Transaction publication. It includes a semiconductor substrate or a semiconductor layer 1 consisting for instance of silicon coated with a metal layer 2 on the lower side. On the upper side, an insulation layer 3, for instance of silicon dioxide, is applied. Over this insulation layer metallization 4 extends in the form of planar, strip-shaped metal layers. The metal layers used consist for instance of aluminum.

The examination results of the above mentioned publication show that in such a structure there can be three basic wave types. These are the dielectric quasi-TEM-mode, the skin effect mode, and the so-called slow wave mode.

These three basic wave types can form under the following conditions. If the product of the frequency of the signal to be transmitted and the resistivity of the semiconductor material of the semiconductor layer is high enough to generate a small dielectric phase angle, the semiconductor layer acts substantially as a dielectricum. In that case, a wave type will form corresponding to a large extent to the TEM-mode (transversal electromagnetic wave) as long as the wave length is much longer than the thickness of the dielectric layer consisting of the semiconductor layer and the insulation layer.

Upon a further increase of the frequency there appears the dispersion effect. The dispersion effect bases on a wave-dependency of the propagation speed of the wave movement. Upon the appearance of this effect there is no longer any approach to the TEM-mode.

If the product of frequency and resistivity is so high that only a low penetration depth in the semiconductor layer can be detected, the semiconductor layer acts like a line surface showing a loss. There forms a wave type in accordance with the skin effect mode.

Additionally to the "dielectric" and "metallic" cutoff characteristics of the structure under consideration there exists finally the third wave type known as slow wave mode. This wave type appears when the frequency is slightly less high and the resistivity is relatively low. In that case, a slow surface wave propagates along the line. This wave type appears, in the frequency resistance range which is of practical significance at present in integrated semiconductor technology, upon the processing of pulses in the subnanosecond range.

Figure 2:
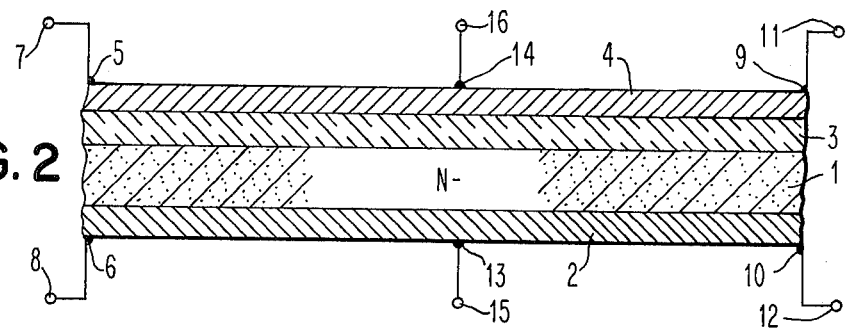
FIG. 2 shows the section view of a semiconductor element according to the invention operating with carrier influence.

A signal coupled in through the input to this line system is altered during its propagation from the input to the output, irrespective of the conducting properties of the system. For a given frequency therefore, in accordance with the above specification, two extreme cases are of specific importance in that connection:

a. the semiconductor material is highly conductive, i.e. in that case the circuit system is in the "slow wave mode". The signal speed is lower than that of the TEM-mode.

b. the semiconductor material is of low conductance, i.e. in that case the circuit system is in the "quasi-TEM-mode" with a corresponding signal speed which is higher than in case a. Taking into consideration these conditions, a typical embodiment is obtained of a semiconductor element in accordance with the invention, as shown in FIG. 2. This is a type where conductivity modulation is effected by means of carrier influence. Basically, the structure corresponds to the semiconductor arrangement with a conductive strip, as shown perspectively in FIG. 1. This structure is represented in a sectional view (cut along this conductive line). Consequently, there is a metal layer 2 on the lower side of semiconductor layer 1. The upper side of the semiconductor layer is covered by insulation layer 3. Applied on insulation layer 3 conductive strip 4 is provided. At the beginning of conductive strip 1 and beneath, at metal layer 2, contacts 5 and 6 are arranged which are respectively connected to an input terminal 7 or 8. At the other end of conductive strip 4, a contact 9 and beneath, at metal layer 2, a contact 10 are provided. Contact 9 is connected to an output terminal 11, and contact 10 is connected to an output terminal 12. Besides, contacts 13 and 14, respectively, are applied at lower metal layer 2 and at conductive strip 4, said contacts being connected to associated control terminals 15 and 16.

The element now operates as follows: If at the two input terminals 7 and 8, an input signal is applied of a frequency which is higher than the already defined relaxation frequency, a corresponding wave propagates from the input along the semiconductive layer, and can be derived at the output as an output signal. If simultaneously a control signal is applied to control terminals 15, 16 whose frequency is much lower than the relaxation frequency, additional carriers are generated or deducted in the semiconductive layer, on the basis of the known field effect, as a function of the polarity of this control signal and the doping of the semiconductor layer. This means, however, that the conductivity of the semiconductor layer is altered, i.e. modulated with the control signal frequency. This conductivity modulation effects a corresponding transit time modulation and/or amplitude modulation of the input signal transmitted via the semiconductor path. In other words, at the output an output signal is received which is altered with respect to transit time, frequency, amplitude and/or phase, as a function of the control signal.

Of course, control terminal 15 can be applied to reference potential, e.g. ground potential. Besides, it is possible to do without separate control contacts 13, 14, or control terminals 15, 16, respectively, and to apply the control signal also e.g. to the input terminals. The individual layers are variable with respect to their thickness and length dimensions. However, it is a condition for the forming of the field effect that insulation layer 3 by sufficiently thin. Indicative information to that effect is obtained from field effect transistor technology which supplies the necessary data also regarding the height of the control signal to be used.

The second embodiment of a semiconductor element according to the invention, which is shown in FIG. 3 again in a sectional view, substantially differs from the embodiment of FIG. 2 in that the conductivity modulation takes place not by means of influence but by carrier injection. For the comparable or identical parts of the arrangement of same reference numbers as in FIG. 2 are used so that a direct comparison is possible. The structure is again a laminar circuitry with semiconductor path 1 which in the present example is N$^-$-doped, and insulation layer 3 provided thereon, with conductive strip 4. Compared with the embodiment of FIG. 2, metal layer 2 is divided there by a P+-doped semiconductor layer which is subdivided into individual separate zones 24 and integrated into the N$^-$-doped semiconductor path 1. P+-doped part zones 24 have contacts 21 which are applied to a common first control connection 22. The zones of N$^-$-doped semiconductor path 1 which appear on the surface between P+-doped part zones 24 show contacts 20. These contacts are connected to a second common control connection 23. One input terminal 7 is connected in turn via contact 5 to conductive strip 4, whereas the other input terminal 8, via a contact 6, is applied to P+-doped part zone 24 at the one end of semiconductor path 1. The corresponding conditions apply to output terminal 11 which in turn is connected to conductive strip 4 whereas output terminal 12, via contact 10, is connected to P+-doped part zone 24 provided there.

The semiconductor element consequently operates as follows: An input signal, applied to input terminals 7 and 8, whose frequency is higher than the relaxation frequency is transmitted via semiconductor path 1, in the already described manner, to output terminals 11, 12. By applying a control signal whose frequency is lower than the relaxation frequency, to control terminals 22 and 23 carriers can be injected into semiconductor path 1. So here, too, a conductivity modulation can be performed by means of the control signal. The highly doped part zones 24 ensure in this process a safe contact with N$^-$-doped semiconductor path 1.

Figure 3:
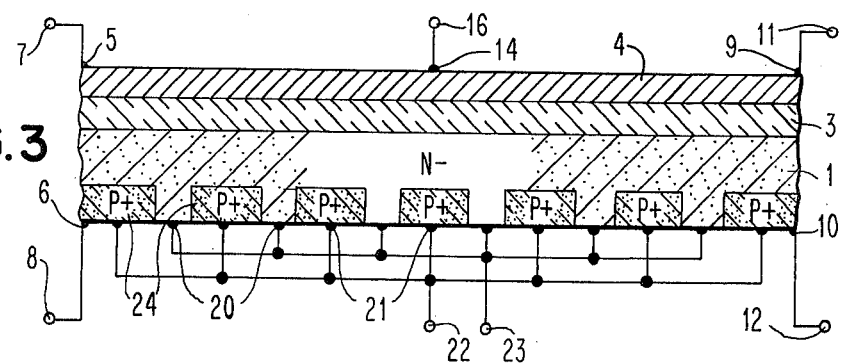
FIG. 3 is the sectional view of a semiconductor element according to the invention operating with carrier injection.
Figure 4:
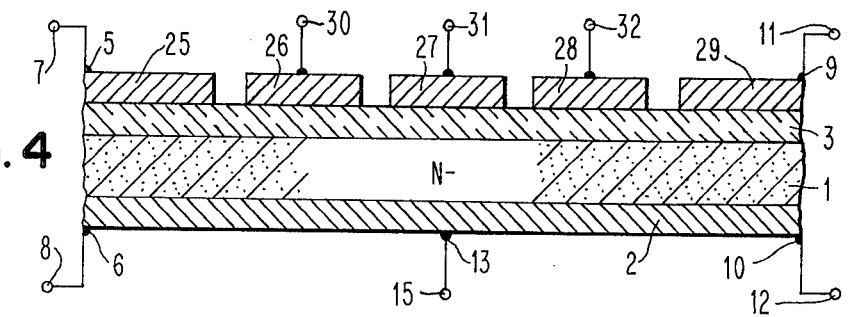
FIG. 4 shows an advantageous development of the embodiment according to FIG. 2.

Examples for the semiconductor elements as disclosed by the invention, in accordance with FIGS. 2 and 3, are represented by the frequency and/or phase and/or amplitude modulation. Such elements are particularly suitable for a kind of pulse-code method. Further fields of use are analog or digital shift registers with adjustable delay time. Finally, such elements can be used for performing a pulse reshaping in accordance with a given program. A development of the embodiment according to FIG. 2 is shown in FIG. 4. The embodiment in accordance with FIG. 4 differs from that of FIG.2 merely in that conductive strip 4 is interrupted and thus consists of parts 25, 26, 27, 28 and 29. Connected to the two outer parts 25 and 29 input terminal 7 and output terminal 11, respectively, are provided. Parts 26, 27, and 28 provided along semiconductor path 1 are provided with control terminals 30, 31 and 32. These parts are therefore addressable separately and independently of each other. This embodiment is suitable for use in the form of a majority logic. The logic levels can for instance be determined as follows: In the case of a logic One the output signal is delayed with respect to the input signal to an extent corresponding at least to the activation of the three parts 26, 27, and 28. If the output signal is delayed to a lesser extent with respect to the input signal, in accordance with only two or less parts of the conductive strip, a logic Zero is obtained. In two extreme cases, an AND or an OR circuit can thus be construed. The following regulation can be selected: only when all parts have been activated the delay is so great that the output signal is considered a logic One; in all other cases it corresponds to a logic Zero. In this manner an AND circuit is obtained.

Only when there is no induced delay the signal is considered a logic One. When there is an induced delay this state is considered a logic Zero. As a function of the number of the activated parts the induced delay can be of discretionary length, as long as at least only one part is activated. In this manner an OR circuit is obtained.

As a summing-up, the following points have to be mentioned. The operation described appears also in those cases where the slow-wave mode is employed exclusively. Advisably, that zone should be selected where the change of the signal speed is a maximum as a function of the conductivity modulation. Similar features apply when operations take place in the cut-off zone between skin affect mode and slow wave mode. There, too, that zone should be selected where the change of the signal speed is a maximum as a function of the conductivity modulation.

It should be pointed out that the carrier injection can be effected also by means of other effects, e.g. by light exposure.

The described semiconductor element can be advantageously combined with Gunn oscillators, and also integrated monolithically. There, the Gunn elements take over the function of the oscillation generation (signal generation), and the semiconductor elements have the function of signal propagation and modulation. An essential feature is that when the semiconductor element as disclosed by the invention is used, the conventional distribution of a network into components and lines is not required. Components and lines are now one and the same. Signal distribution takes place during propagation. Thus, the difficulties of each conventional signal processing network are avoided where signal modulation takes always place locally. The lines connect these localized elements, undesired delays and distortions occurring in the process. These increase to the same degree as the frequency. In the concept according to the invention, precisely these distortions and delays are made use of for signal modulation and combination.

While the invention has been particularly shown and described with reference to the preferred embodiments thereof, it will be understood that those skilled in the art that the changes in form and detail may be made therein without departing from the spirit and scope of the invention.

What is claimed is:

1. Controllable semiconductor element with an active semiconductor path controlled by conductivity modulation comprising:
    a laminar circuit system with a semiconductor layer;
    on the surface of said semiconductor layer is first an insulation layer and then a conductive strip thereover;
    separate zones doped opposite to the said semiconductor layer are in said semiconductor layer on the side opposite to that of said conductive strip;
    means for electrically contacting and connecting said doped zones;
    means for electrically contacting and connecting the interspaced regions of the said semiconductor layer between said doped zones;
    an input signal on the one end and an output signal at the other end of the said circuit system being applied or deducted, respectively, between said conductive strip and the said doped zones provided there; and
    means for applying a control signal to said means for contacting and connecting said doped zones along the semiconductor layer.

2. Controllable semiconductor element in accordance with claim 1 wherein the conductivity modulation is effected by means of carrier injection to said doped zones.

3. Controllable semiconductor element as claimed in claim 1 wherein it is used for a majority logic.

4. Controllable semiconductor element comprising:
    a laminar circuit system with a lamination sequence consisting of a conductive layer, a semiconductor layer, an insulation layer, and finally a conductive strip;
    the said conductive strip is interrupted and forms separately addressable electrodes;
    means for applying an input signal at one end of said circuit system between the said conductive strip and said conductive layer;
    means for deducting an output signal at the other end of the said circuit system between the said conductive strip and the said conductive layer; and
    control means connected to said conductive layer and said conductive strip which, by means of conductivity modulation, with a control frequency lower than the dielectric relaxation frequency the transit time of the signal guided via the said semiconductor layer can be controlled.

5. Controllable semiconductor element as claimed in claim 4 wherein said controllable element is integrated with a Gunn oscillator element into an integrated circuit wherein the said Gunn element is a signal generator and said controllable element is the signal propagator and modulator.

* * * * *